United States Patent
Yu et al.

(10) Patent No.: US 9,294,104 B2
(45) Date of Patent: Mar. 22, 2016

(54) PHASE-LOCKED LOOP CIRCUIT WITH IMPROVED PERFORMANCE

(71) Applicant: Intel Corporation, Santa Clara, CA (US)

(72) Inventors: Shih-An Yu, Taipei (TW); Sen-You Liu, Taipei (TW); Fang-Ren Liao, Taipei (TW); Yi-Pei Su, Taipei (TW)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/332,614

(22) Filed: Jul. 16, 2014

(65) Prior Publication Data

US 2016/0020773 A1 Jan. 21, 2016

(51) Int. Cl.

| | |
|---|---|
| *H03L 7/087* | (2006.01) |
| *H03L 7/089* | (2006.01) |
| *H03L 7/093* | (2006.01) |
| *H03L 7/18* | (2006.01) |
| *H03L 7/08* | (2006.01) |
| *H03L 7/099* | (2006.01) |
| *H03B 5/32* | (2006.01) |
| *H02M 3/07* | (2006.01) |

(52) U.S. Cl.
CPC . *H03L 7/08* (2013.01); *H02M 3/07* (2013.01); *H03B 5/32* (2013.01); *H03L 7/087* (2013.01); *H03L 7/0893* (2013.01); *H03L 7/093* (2013.01); *H03L 7/099* (2013.01); *H03L 7/18* (2013.01)

(58) Field of Classification Search
CPC ........... H03L 7/08; H03L 7/085; H03L 7/087; H03L 7/089; H03L 7/0891; H03L 7/0893; H03L 7/0895; H03L 7/0896; H03L 7/0898; H03L 7/093; H03L 7/18
USPC ........ 327/147, 148, 156, 157; 331/11, 16, 17, 331/25; 375/373–375
See application file for complete search history.

(56) References Cited

U.S. PATENT DOCUMENTS

| | | | | |
|---|---|---|---|---|
| 7,078,948 B2 * | 7/2006 | Dosho | ........................... | 327/157 |
| 7,091,759 B2 * | 8/2006 | Sowlati et al. | ................ | 327/157 |
| 7,436,264 B2 * | 10/2008 | Yu | ................................... | 331/17 |
| 7,439,816 B1 * | 10/2008 | Lombaard | ........................ | 331/16 |
| 7,443,249 B2 * | 10/2008 | Song | .............................. | 331/17 |
| 8,022,774 B2 * | 9/2011 | Ueno et al. | ...................... | 331/17 |
| 8,031,027 B2 * | 10/2011 | Park et al. | ...................... | 331/186 |
| 8,125,254 B1 * | 2/2012 | Ding | ............................. | 327/156 |
| 8,334,726 B2 * | 12/2012 | Kawamoto | ........................ | 331/17 |
| 2003/0142775 A1 * | 7/2003 | Takeshita et al. | ............. | 375/376 |
| 2006/0017476 A1 * | 1/2006 | Jung et al. | ...................... | 327/156 |
| 2007/0132490 A1 * | 6/2007 | Robinson et al. | ............. | 327/156 |
| 2013/0076450 A1 * | 3/2013 | Rao et al. | ......................... | 331/34 |

* cited by examiner

*Primary Examiner* — Levi Gannon
(74) *Attorney, Agent, or Firm* — Forefront IP Lawgroup, PLLC

(57) ABSTRACT

A phase-locked loop circuit includes a phase detector, a charge pump, a capacitor, and a capacitor multiplier. The phase detector receives a reference frequency and a feedback frequency to generate a up/down signal. The charge pump, which includes a positive node and a negative node, receives the up/down signal to generate a first current. The capacitor is coupled to the negative node. The capacitor multiplier, coupled to the negative node, generates a second current which is the first current divided by a first scaling number.

22 Claims, 3 Drawing Sheets

PHASE-LOCKED LOOP CIRCUIT WITH IMPROVED PERFORMANCE

BACKGROUND OF THE INVENTION

1. Field of the Invention

The disclosure relates generally to a phase-locked loop circuit, and more particularly to a phase-locked loop circuit having both advantages of type 1 and type 2.

2. Description of the Related Art

A phase-locked loop (PLL) is an electronic circuit with an oscillator. A PLL adjusts the frequency of a feedback signal from the output of the oscillator to match in phase the frequency of an input reference clock signal. Phase-locked loops (PLLs) are an essential building block of many integrated circuits, providing periodic signals for data recovery, data transfer, and other clocking functions.

A PLL may be used to generate a signal, modulate or demodulate a signal, reconstitute a signal with less noise, or multiply or divide a frequency. For example, a PLL may supply a clock signal to one or more counters or dividers that divide a signal from the oscillator to a lower frequency clock signal for distribution around an integrated circuit. As another example, a PLL may be used to stabilize the frequency of a communications channel.

BRIEF SUMMARY OF THE INVENTION

For solving the above problems, the invention provides a machine authentication device and method for quickly processing authentication and setting. The invention further integrates machines with various transmission types and makes data access between machines easier.

In one embodiment, a phase-locked loop circuit includes a phase detector, a charge pump, a capacitor, and a capacitor multiplier. The phase detector receives a reference frequency and a feedback frequency to generate an up/down signal. The charge pump, which includes a positive node and a negative node, receives the up/down signal to generate a first current. The capacitor is coupled to the negative node. The capacitor multiplier, coupled to the negative node, generates a second current which is the first current divided by a first scaling number.

In another embodiment, a phase-locked loop circuit includes a first phase detector, a first charge pump, a capacitor, and a capacitor multiplier. The first phase detector receives a first reference signal with a first reference frequency and a first feedback signal with a first feedback frequency to generate a first up/down signal. The first charge pump, which includes a first output node, receives the first up/down signal to generate a first current signal at the first output node. The capacitor is coupled to the second output node. The capacitor multiplier, which is coupled to the second output node, receives the first reference signal and the first feedback signal to generate a second current signal on the second output node. The second current signal is out-phase with the first current signal.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
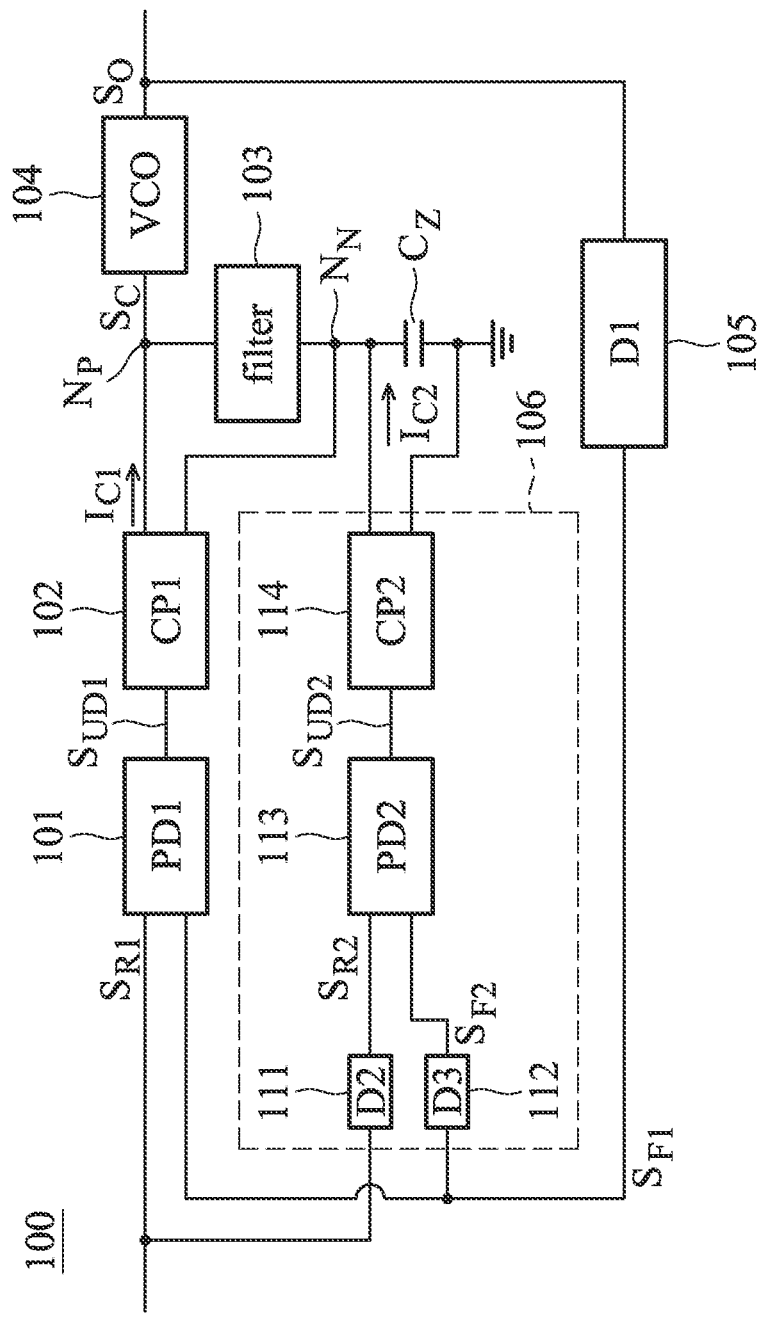
FIG. 1 is a block diagram of an embodiment of the invention of the phase-locked loop circuit.

FIG. 1 is a block diagram of an embodiment of the invention of the phase-locked loop circuit. As shown in FIG. 1, the phase-locked loop circuit 100 includes the first phase detector (PD1) 101, the first charge pump (CP1) 102, the filter 103, the voltage-controlled oscillator (VCO) 104, the first frequency divider (D1) 105, the capacitor multiplier 106, and the capacitor $C_Z$. The first phase detector 101 receives the first reference signal $S_{R1}$ with the first reference frequency $F_{R1}$ and the first feedback signal $S_{F1}$ with the first feedback frequency $F_{F1}$ to generate the first up/down signal $S_{UD1}$. In an embodiment of the invention, when the first reference frequency $F_{R1}$ is greater than the first feedback frequency $F_{F1}$, or the phase of the first reference signal $S_{R1}$ is leading that of the first feedback signal $S_{F1}$, the first up/down signal is at a high logic level; when the first reference frequency $F_{R1}$ is less than the first feedback frequency $F_{F1}$, or the phase of the first reference signal $S_{R1}$ is lagging that of the first feedback signal $S_{F1}$, the first up/down signal is at a low logic level.

In another embodiment of the invention, when the first reference frequency $F_{R1}$ is greater than the first feedback frequency $F_{F1}$, or phase of the first reference signal $S_{R1}$ is prior to that of the first feedback signal $S_{F1}$, the first up/down signal is in low logic level; when the first reference frequency $F_{R1}$ is less than the first feedback frequency $F_{F1}$, or phase of the first reference signal $S_{R1}$ is posterior to that of the first feedback signal $S_{F1}$, the first up/down signal is in high logic level, respectively.

The first charge pump 102, which includes the positive output node $N_P$ and the negative output node $N_N$, receives the first up/down signal $S_{UD1}$ to generate a first current signal $I_{C1}$. According to an embodiment of the invention, the first current signal $I_{C1}$ is generated when the first up/down signal $S_{UD1}$ is in high logic level, and being choked when the first up/down signal $S_{UD1}$ is in low logic level. According to another embodiment of the invention, the first current signal $I_{C1}$ is generated when the first up/down signal $S_{UD1}$ is in low logic level, and being choked when the first up/down signal $S_{UD1}$ is in high logic level.

The filter 103 is coupled between the positive output node $N_P$ and the negative output node $N_N$ and converts the first current signal $I_{C1}$ to the control signal $S_C$. According to an embodiment of the invention, the filter 103 includes a resistor. When the first current signal $I_{C1}$ is flowing through the resistor, the first current signal $I_{C1}$ is converted to the control signal $S_C$.

The VCO 104 receives the control signal $S_C$ and generates an output signal $S_O$ with the output frequency $F_O$ by using the control signal $S_C$. The first frequency divider 105 generates the first feedback signal $S_{F1}$ with the first feedback frequency $F_{F1}$ by dividing the output signal $S_O$ by the first scaling number M. That is, the first feedback frequency $F_{F1}$ is the output frequency $F_O$ divided by the first scaling number M. The capacitor $C_Z$ is coupled to the negative output node $N_N$. According to an embodiment of the invention, the capacitor $C_Z$ and the resistor of the filter 103 generate a zero in the loop of the phase-locked loop circuit 100.

The capacitor multiplier 106, which is coupled to the negative output node $N_N$, receives the first reference signal $S_{R1}$ and the first feedback signal $S_{F1}$ to generate a second current signal $I_{C2}$ which is the first current signal $I_{C1}$ divided by a second scaling number N. While the capacitor $C_Z$ is charged by the second current signal $I_{C2}$ which is less than the first current signal $I_{C1}$, the effective capacitance of the capacitor $C_Z$ is amplified by the capacitor multiplier 106. In other words, since the resistor of the filter 103 and the capacitor $C_Z$ are used to create a zero of the phase-locked loop circuit 100, the capacitor $C_Z$ should be charged by the first current signal $I_{C1}$. However, the capacitor $C_Z$ is charged by the second current signal $I_{C2}$ instead after applying the capacitor multiplier 106, such that the charging period of the capacitor $C_Z$ has been lengthened, which means the effective capacitance of the capacitor $C_Z$ has been amplified.

In PLL circuit design, usually, the capacitance of the capacitor $C_Z$ should be very large to make the zero generated by the capacitor $C_Z$ and the resistor of the filter 103 near DC. According to an embodiment of the invention, the capacitor $C_Z$ is 2 nF without the capacitor multiplier 106, and it can be shrunk to 500 pF with the capacitor multiplier 106. The reduction ratio can be further increased according to the designer's choice. Therefore, the area in the chip disposed for the capacitor $C_Z$ could be reduced.

In an embodiment of the invention, the capacitor multiplier 106 includes the second frequency divider (D2) 111, the third frequency divider (D3) 112, the second phase detector (PD2) 113, and the second charge pump (CP2) 114. The second frequency divider 111 receives the first reference signal $S_{R1}$ to generate the second reference signal $S_{R2}$ with the second reference frequency $F_{R2}$, where the second reference frequency $F_{R2}$ is the first reference frequency $F_{R1}$ divided by the second scaling number N. The third frequency divider 112 receives the first feedback signal $S_{F1}$ to generate the second feedback signal $S_{F2}$ with the second reference frequency $F_{F2}$, where the second feedback frequency $F_{F2}$ is the first feedback frequency $F_{F1}$ divided by the second scaling number N.

The ratio of the first current signal $I_{C1}$ to the second current signal $I_{C2}$ equals to the second scaling number N, which means the amplifying ratio of the capacitance of the capacitor $C_Z$ is determined by the second scaling number N. For example, in an embodiment of the invention, the second scaling number N is 4. The second frequency divider 111 divides the first reference frequency $F_{R1}$ by 4, and the third frequency divider 112 also divides the first feedback frequency $F_{F1}$ by 4. It makes the second current signal $I_{C2}$ is a quarter of the first current signal $I_{C1}$ to charge the capacitor $C_Z$, and the charging time of the capacitor $C_Z$ has been quadrupled, compared to charging by the first current signal $I_{C1}$, and this results in quadrupling the effective capacitance of the capacitor $C_Z$.

The second phase detector 113 receives the second reference signal $S_{R2}$ and the second feedback signal $S_{F2}$ to generate the second up/down signal $S_{UD2}$. In an embodiment of the invention, when the second reference frequency $F_{R2}$ is greater than the second feedback frequency $F_{F2}$, or phase of the second reference signal $S_{R2}$ is prior to that of the second feedback signal $S_{F2}$, the second up/down signal is in high logic level; when the second reference frequency $F_{R2}$ is less than the second feedback frequency $F_{F2}$, or phase of the second reference signal $S_{R2}$ is posterior to that of the second feedback signal $S_{F2}$, the second up/down signal $S_{UD2}$ is in low logic level, respectively.

In another embodiment of the invention, when the second reference frequency $F_{R2}$ is greater than the second feedback frequency $F_{F2}$, or phase of the second reference signal $S_{R2}$ is prior to that of the second feedback signal $S_{F2}$, the second up/down signal is in low logic level; when the second reference frequency $F_{R2}$ is less than the second feedback frequency $F_{F2}$, or phase of the second reference signal $S_{R2}$ is posterior to that of the second feedback signal $S_{F2}$, the second up/down signal $S_{UD2}$ is in high logic level, respectively.

The second charge pump 114 receives the up/down signal $S_{UD2}$ to generate the second current signal $I_{C2}$, and the second current signal $I_{C2}$ is applied to the capacitor $C_Z$. According to an embodiment of the invention, the second current signal $I_{C2}$ is generated when the second up/down signal $S_{UD2}$ is in high logic level, and being choked when the second up/down signal $S_{UD2}$ is in low logic level. According to another embodiment of the invention, the second current signal $I_{C2}$ is generated when the second up/down signal $S_{UD2}$ is in low logic level, and being choked when the second up/down signal $S_{UD2}$ is in high logic level.

Figure 2:
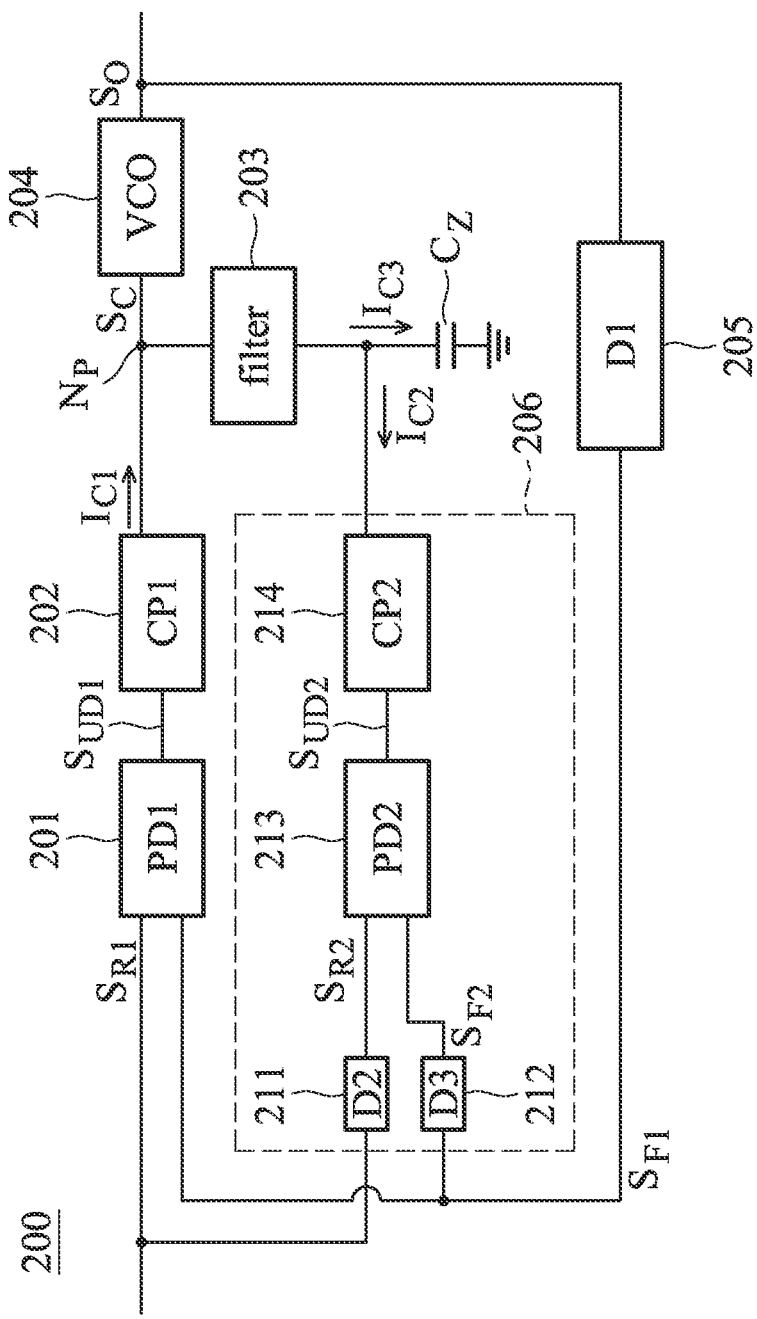
FIG. 2 shows a block diagram of another embodiment of the invention of the phase-locked loop circuit.

FIG. 2 shows a block diagram of another embodiment of the invention of the phase-locked loop circuit. Comparing FIG. 1 with FIG. 2, the first charge pump 202 and the second charge pump 214 are single-ended, and the second current signal $I_{C2}$ is out-phase with the first current signal $I_{C1}$. It makes the charging current signal $I_{C3}$ into the second current signal $I_{C2}$ subtracted from the first current signal $I_{C1}$, such that the effective capacitance of the capacitor $C_Z$ has been amplified.

Figure 3:
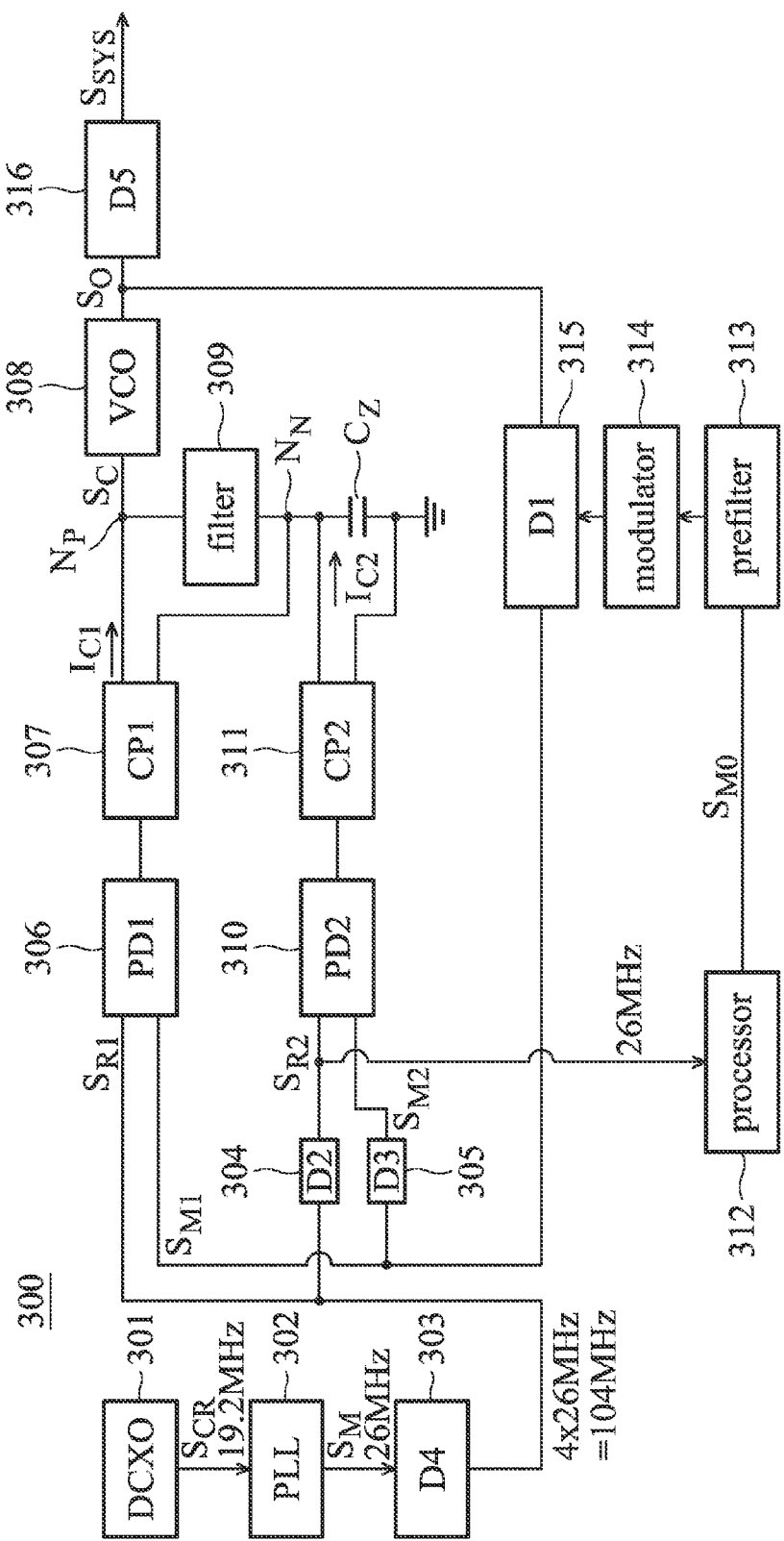
FIG. 3 shows a block diagram of the preferred embodiment of the invention of the phase-locked loop circuit.

FIG. 3 shows a block diagram of the preferred embodiment of the invention of the phase-locked loop circuit. As shown in FIG. 3, the PLL circuit 300 is for GSM and CDMA communication by using the concept of the embodiment of FIG. 1. The first reference signal $S_{R1}$ is generated by the crystal oscillator (DCXO) 301, the simplified phase-locked loop circuit (PLL) 302, and the fourth frequency divider 303. The crystal oscillator generates the crystal signal $S_{CR}$ with 19.2 MHz and provides the crystal signal $S_{CR}$ for the simplified phase-locked loop circuit 302. In the conventional CDMA communication devices, the crystal signal's frequency is 19.2 MHz, but this embodiment is also used in the GSM communication devices. And the GSM communication devices need the crystal signal's frequency to be 26 MHz. Therefore, the simplified phase-locked loop circuit 302 is configured to generate an intermediate signal $S_M$ with the intermediate frequency $F_M$ being 26 MHz. That makes the embodiment could be used in both CDMA and GSM communication devices. The fourth frequency divider (D4) 303 receives the intermediate signal $S_M$ to generate the first reference signal $S_{R1}$. It makes the first reference frequency $F_{R1}$ equal to the intermediate frequency $F_M$ multiplied by a reference scaling number of 4, such that the first reference frequency $F_{R1}$ is 104 MHz.

The second frequency divider (D2) 304 generates the second reference frequency $F_{R2}$ by dividing the first reference frequency $F_{R1}$ by the second scaling number N which is 4. In addition, the third frequency divider (D3) 305 also divides the first feedback frequency $F_{F1}$ by 4 to generate the second feedback frequency $F_{F2}$. The operations of PD1 306, CP1 307, VCO 308, filter 309, PD2 310, and CP2 311 are the same as the embodiment of FIG. 1. Since the processor 312, which is applied in GSM communication, operates in 26 MHz, the processor 312 takes the 26 MHz second reference signal $S_{R2}$ to be its clock without any extra effort. The processor 312 receives the second reference signal $S_{R2}$ and output the base band modulation signal. The processor 312 sends the modulation signal $S_{MO}$ to request the pre-filter 313 and the modulator 314 to modulate the first scaling number M of the first frequency divider 315 for changing the output frequency $F_O$. As the first scaling number M is modulated, the output frequency $F_O$ changes accordingly, and the output frequency $F_O$ equals to the first reference frequency $F_{R1}$ multiplied by the first scaling number M.

Since the PLL could make its output signal's frequency changed as the way its ratio changed, the PLL are always used as a frequency modulator. But the bandwidth of the PLL's frequency response is limited, which makes this kind of frequency modulator has a limitation in signal bandwidth. So the pre-filter 313 is included in this embodiment. The frequency response of pre-filter 313 is the reciprocal of that of the PLL, therefore the bandwidth of this kind of frequency modulator is increased to beyond that of the PLL. The pre-filter 313 has a transfer function which is used to compensate for the transfer function of the phase-locked loop circuit 300 for a uniform gain response over the bandwidth of the phase-locked loop circuit 300. The modulator 314 is configured to modulate the first frequency divider 315. According to an embodiment of the invention, the modulator 314 is a 2nd-order delta-sigma modulator. The delta-sigma modulator is pure digital modulator and could modulate a fraction ratio into an integer ration. Compared to the 3rd-order delta-sigma modulator, the 2nd-order delta-sigma modulator asked for less linearity inside the PLL.

The fifth frequency divider 316 receives the output signal $S_O$ to generate the system signal $S_{SYS}$ with the system frequency $F_{SYS}$. The system frequency $F_{SYS}$ equals to the output frequency divided by the output scaling number. According to an embodiment of the invention, the output scaling number is 4. For suppressing the noise of the signal generated by the phase-locked loop circuit 300, the in-loop frequencies, such as the first reference frequency $F_{R1}$, the first feedback frequency, and the output frequency $F_O$, are quadrupled. However, the processor 312 of GSM communication operates at 26 MHz, such that the system frequency $S_{SYS}$ generated by the phase-locked loop circuit 300 should be divided by the output scaling number for proper use. In this embodiment, the first reference frequency $F_{R1}$, the first feedback frequency, and the output frequency $F_O$, are quadrupled, so that the area in the chip disposed for the capacitor, the noise come from the modulator 314 and the infection of all the power amplifier (not shown) in the circuit could all be reduced.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A phase-locked loop circuit, comprising:
   a first phase detector receiving a first reference signal with a first reference frequency and a first feedback signal with a first feedback frequency to generate a first up/down signal;
   a first charge pump comprising a positive output node and a negative output node, wherein the first charge pump receives the first up/down signal to generate a first current signal;
   a capacitor, coupled between the negative output node of the first charge pump and the ground; and
   a capacitor multiplier, coupled to the negative output node of the first charge pump, receiving the first reference signal and the first feedback signal to generate a second current signal, wherein the second current signal is the first current signal divided by a first scaling number.

2. The phase-locked loop circuit of claim 1, wherein the capacitor multiplier comprises:
   a first frequency divider, comprising the first scaling number, receiving the first reference signal to generate a second reference signal with a second reference frequency, wherein the second reference frequency is the first reference frequency divided by the first scaling number; and
   a second frequency divider, comprising the first scaling number, receiving the first feedback signal to generate a second feedback signal with a second feedback frequency, wherein the second feedback frequency is the first feedback frequency divided by the first scaling number.

3. The phase-locked loop circuit of claim 2, wherein the capacitor multiplier further comprises:
   a second phase detector receiving the second reference signal and a second feedback signal to generate a second up/down signal; and
   a second charge pump coupled to the negative output node, wherein the second charge pump receives the second up/down signal to generate a second current signal.

4. The phase-locked loop circuit of claim 2, wherein the first scaling number is 4, and the second reference frequency is 26 MHz.

5. The phase-locked loop circuit of claim 1, further comprising:
   a filter, coupled between the positive output node and the negative output node, receiving the first current signal to generate a control signal;
   a voltage-controlled oscillator, generating an output signal with an output frequency by using the control signal; and
   a third frequency divider, comprising a second scaling number, generating the first feedback signal with the first feedback frequency, wherein the first feedback frequency is the output frequency divided by the second scaling number.

6. The phase-locked loop circuit of claim 1, wherein the filter comprises:
   a resistor coupled between the positive output node and the negative output node, wherein the resistor converts the first current signal to the control signal.

7. The phase-locked loop circuit of claim 1, further comprising:
   a crystal oscillator generating a crystal signal with a crystal frequency;
   a simplified phase-locked loop circuit receiving the first signal to generate an intermediate signal with an intermediate frequency; and
   a fourth frequency divider, comprising a reference scaling number, receiving the intermediate signal to generate the first reference signal.

8. The phase-locked loop circuit of claim 7, wherein the crystal frequency is 19.2 MHz, the intermediate frequency is 26 MHz, the reference scaling number is 4, and the first reference frequency is 104 MHz.

9. The phase-locked loop circuit of claim 1, further comprising:
   a modulator, coupled to the first frequency divider, configured to modulate the second scaling number;
   a pre-filter comprising a matching transfer function, wherein the matching transfer function is configured to compensate a transfer function of the phase-locked loop circuit; and a processor receiving the second reference signal and coupled to the pre-filter, wherein the processor generates a modulation signal for modulating the second scaling number.

10. The phase-locked loop circuit of claim 9, wherein the modulator is a second-order delta-sigma modulator, and the second reference frequency is 26 MHz.

11. The phase-locked loop circuit of claim 1, further comprising:
a fifth frequency divider receiving the output signal to generate a system signal with a system frequency, wherein the system frequency is the output frequency divided by an output scaling number, and wherein the output scaling number is 4.

12. A phase-locked loop circuit, comprising:
a first phase detector receiving a first reference signal with a first reference frequency and a first feedback signal with a first feedback frequency to generate a first up/down signal;
a first charge pump comprising a first output node, wherein the first charge pump receives the first up/down signal to generate a first current signal at the first output node;
a capacitor, coupled to a second output node; and
a capacitor multiplier, comprising the second output node, receiving the first reference signal and the first feedback signal to generate a second current signal on the second output node, wherein the second current signal is reversed phase to the first current signal.

13. The phase-locked loop circuit of claim 12, wherein the capacitor multiplier comprises:
a first frequency divider, comprising a first scaling number, receiving the first reference signal to generate a second reference signal with a second reference frequency, wherein the second reference frequency is the first reference frequency divided by the first scaling number; and
a second frequency divider, comprising the first scaling number, receiving the first feedback signal to generate a second feedback signal with a second feedback frequency, wherein the second feedback frequency is the first feedback frequency divided by the first scaling number.

14. The phase-locked loop circuit of claim 13, wherein the first scaling number is 4, and the second reference frequency is 26 MHz.

15. The phase-locked loop circuit of claim 12, further comprising:
a filter, coupled to the first output node and the second output node, receiving the first current signal to generate a control signal;
a voltage-controlled oscillator, generating an output signal with an output frequency by using the control signal; and
a third frequency divider, comprising a second scaling number, generating the first feedback signal with the first feedback frequency, wherein the first feedback frequency is the output frequency divided by the second scaling number.

16. The phase-locked loop circuit of claim 15, wherein the capacitor multiplier further comprises:
a second phase detector receiving a second reference signal and a second feedback signal to generate a second up/down signal; and
a second charge pump coupled to the second output node, wherein the second charge pump receives the second up/down signal to generate a second current signal.

17. The phase-locked loop circuit of claim 16, further comprising:
a modulator, coupled to the first frequency divider, configured to modulate the second scaling number;
a pre-filter comprising a matching transfer function, wherein the matching transfer function is configured to compensate a transfer function of the phase-locked loop circuit; and
a processor receiving the second reference signal and coupled to the pre-filter, wherein the processor generates a modulation signal for modulating the second scaling number.

18. The phase-locked loop circuit of claim 17, wherein the modulator is a second-order delta-sigma modulator, and the second reference frequency is 26 MHz.

19. The phase-locked loop circuit of claim 12, wherein the filter comprises:
a resistor coupled between the first output node and the second output node, wherein the resistor converts the first current signal to the control signal.

20. The phase-locked loop circuit of claim 12, further comprising:
a crystal oscillator generating a crystal signal with a crystal frequency;
a simplified phase-locked loop circuit receiving the first signal to generate an intermediate signal with an intermediate frequency; and
a fourth frequency divider, comprising a reference scaling number, receiving the intermediate signal to generate the first reference signal.

21. The phase-locked loop circuit of claim 20, wherein the crystal frequency is 19.2 MHz, the intermediate frequency is 26 MHz, the reference scaling number is 4, and the first reference frequency is 104 MHz.

22. The phase-locked loop circuit of claim 12, further comprising:
a fifth frequency divider receiving the output signal to generate a system signal with a system frequency, wherein the system frequency is the output frequency divided by an output scaling number, and wherein the output scaling number is 4.

* * * * *